United States Patent
Divakaruni et al.

(10) Patent No.: US 6,503,798 B1
(45) Date of Patent: Jan. 7, 2003

(54) LOW RESISTANCE STRAP FOR HIGH DENSITY TRENCH DRAMS

(75) Inventors: Ramachandra Divakaruni, Somers, NY (US); Jeffrey P. Gambino, Westford, VT (US); Herbert L. Ho, Cornwall, NY (US); Akira Sudo, Poughkeepsie, NY (US)

(73) Assignees: International Business Machines Corporation, Armonk, NY (US); Kabushiki Kaisha Toshiba, Kawasaki (JP)

( * ) Notice: Subject to any disclaimer, the term of this patent is extended or adjusted under 35 U.S.C. 154(b) by 166 days.

(21) Appl. No.: 09/609,168

(22) Filed: Jun. 30, 2000

(51) Int. Cl.$^7$ ............................................. H01L 21/336
(52) U.S. Cl. ...................... 438/268; 438/234; 438/243; 438/253; 257/301; 257/305
(58) Field of Search ................................ 438/268, 234, 438/243, 253; 257/301, 305

(56) References Cited

U.S. PATENT DOCUMENTS

| | | | |
|---|---|---|---|
| 5,065,273 A | 11/1991 | Rajeevakumar | 361/313 |
| 5,360,758 A | 11/1994 | Bronner et al. | 257/305 |
| 5,422,294 A * | 6/1995 | Noble, Jr. | 437/52 |
| 5,670,805 A | 9/1997 | Hammerl et al. | 257/301 |
| 5,719,080 A | 2/1998 | Kenney | 438/243 |
| 5,770,876 A | 6/1998 | Lam et al. | 257/301 |
| 5,780,335 A | 7/1998 | Henkels et al. | 438/243 |
| 5,827,765 A | 10/1998 | Stengl et al. | 438/243 |
| 5,874,758 A | 2/1999 | DeBrosse | 257/305 |
| 5,909,044 A | 6/1999 | Chakravarti et al. | 257/301 |
| 5,923,971 A * | 7/1999 | Ho et al. | 438/245 |
| 5,943,581 A | 8/1999 | Lu et al. | 438/386 |
| 5,953,607 A | 9/1999 | Hakey et al. | 438/249 |
| 6,140,175 A * | 10/2000 | Kleinhenz et al. | 438/243 |
| 6,177,698 B1 * | 1/2001 | Gruening et al. | 257/302 |

* cited by examiner

Primary Examiner—Amir Zarabian
Assistant Examiner—Pho M. Luu
(74) Attorney, Agent, or Firm—Ira D. Blecker; McGinn & Gibb, PLLC

(57) ABSTRACT

A method and structure for a dynamic random access device which includes a substrate having a trench, a conductor in the trench, a transistor adjacent the trench and a conductive strap electrically connecting the conductor and the transistor, wherein the strap comprises a plurality of strap conductors and the strap has a lower resistance than the conductor. The conductor comprises a first material having a first resistance and the strap comprises a second material different than the first material having a second resistance, wherein the second resistance is lower than the first resistance. The plurality of strap conductors comprises at least two electrically connected strap conductors, and a first strap conductor is adjacent the conductor and a second strap conductor is adjacent the transistor and the first strap conductor has an improved interface with the conductor. The strap comprises a lip strap, wherein the strap forms an L-shape. At least one of the plurality of the strap conductors is contiguous with a corner of the trench, and the plurality of strap conductors comprises a first strap conductor and a second strap conductor and the conductor is contiguous with the first strap conductor and the second strap conductor such that the second strap conductor and the conductor form an L-shape.

14 Claims, 5 Drawing Sheets

LOW RESISTANCE STRAP FOR HIGH DENSITY TRENCH DRAMS

BACKGROUND OF THE INVENTION

1. Field of the Invention

The present invention generally relates to a method of formation of a low resistive strap for high density trench drams.

2. Description of the Related Art

Conventional processing of trench dynamic random access memory (DRAM) structures forms a buried strap at the top of the deep trench. The strap resistance has been shown to be a significant bottleneck in trench DRAM characteristics. The conventional process causes the strap to be etched away in unwanted areas during the shallow trench isolation (STI) definition (which is defined by the AA or Active Area mask) leaving a sliver of silicon along the trench sidewalls to contact to the deep trench portion below the STI. This contributes significantly to the strap resistance variation since the resistance of the above mentioned sliver is dependent on (Deep Trench) DT-AA overlay which is limited by tool capability.

Various schemes have been proposed (sometimes with an oxide cap on top of the trench referred to as a 'Pedestal' STI) leaving the polysilicon in the trench untouched but etching only the silicon outside the trench or performing the strap recess after the active area (AA) etch with a 'Poly Planarized' STI etch. However, neither of these schemes work with a 'lip' or near surface strap which is deemed necessary to avoid a deep strap and consequent poor array device performance. It is also to be noted that all of the schemes above do not address the increased strap resistance of a dielectric present at the strap poly silicon interface. Therefore, there is a need for a method of forming a DRAM structure with a low resistance strap.

SUMMARY OF THE INVENTION

It is, therefore, an object of the present invention to provide a structure and method for a dynamic random access device which includes a substrate having a trench, a conductor in the trench, a transistor adjacent to the trench and a conductive strap electrically connecting the conductor and the transistor, wherein the strap has a lower resistance than the conductor. The conductor comprises a first material having a first resistance and the strap comprises a second material different than the first material having a second resistance, wherein the second resistance is lower than the first resistance. The strap comprises at least two electrically connected strap conductors. A first strap conductor is adjacent to the conductor and a second strap conductor is adjacent the transistor and the first strap conductor has an improved interface with the conductor. The strap comprises a lip strap, and the first strap forms an L-shape. The first strap is contiguous with a corner of the trench. The strap comprises a first strap conductor and a second strap conductor and the conductor is contiguous with the first strap conductor and the second strap conductor wherein the second strap conductor and the conductor form an L-shape.

The invention further comprises a method of forming a dynamic random access memory device which includes forming a trench in a substrate, placing a conductor in the trench, placing a transistor adjacent to the trench forming a conductive strap which electrically connects the conductor and the transistor, wherein the strap comprises a plurality of strap conductors and the strap has a lower resistance than the conductor.

BRIEF DESCRIPTION OF THE DRAWINGS

The foregoing and other objects, aspects and advantages will be better understood from the following detailed description of a preferred embodiment of the invention with reference to the drawings, in which:

FIGS. 1a–1f depict one embodiment of the low resistance strap and its formation;

DETAILED DESCRIPTION OF PREFERRED EMBODIMENTS OF THE INVENTION

The present invention comprises an improved DRAM structure with a low resistance strap, and its method of manufacturing. The first embodiment of the invention is shown in FIG. 1b. The invention has two straps 22 which each abut collar oxide 10 and a conductor 12 such as polysilicon which is located between the collar oxide 10. The straps 22 are made of a conductive material such as tungsten silicide (WSix), titanium nitride (TiN) or tantalum silicon nitride (TaSiN) or other conductive material that is well known to others skilled in the art. The materials for the strap are preferably selected from a group of materials that have a higher conductance than the conductor 12 located between the collar oxides. Each strap is designed to provide a channel through which the conductor 12 can be connected to an active device on the silicon wafer.

Figure 1B:
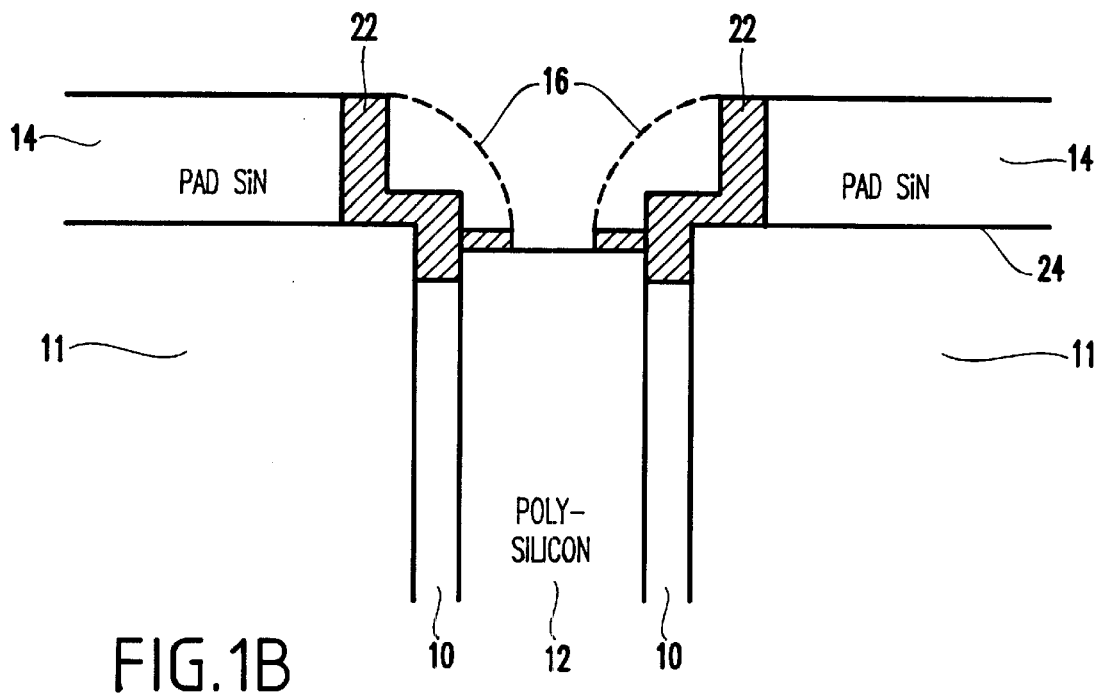
Figure 2A:
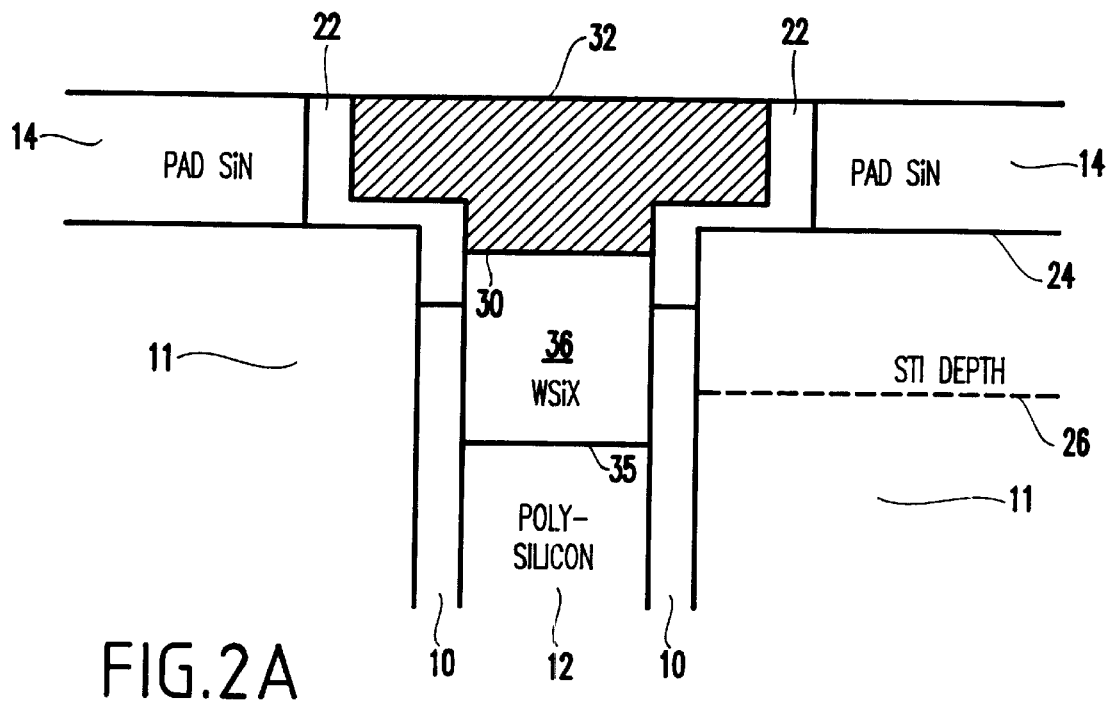
FIGS. 2a–2d depict a second embodiment of the low resistance strap and its formation; and, FIGS. 3a–3c depict a third embodiment of the low resistance strap and its formation.
Figure 2B:
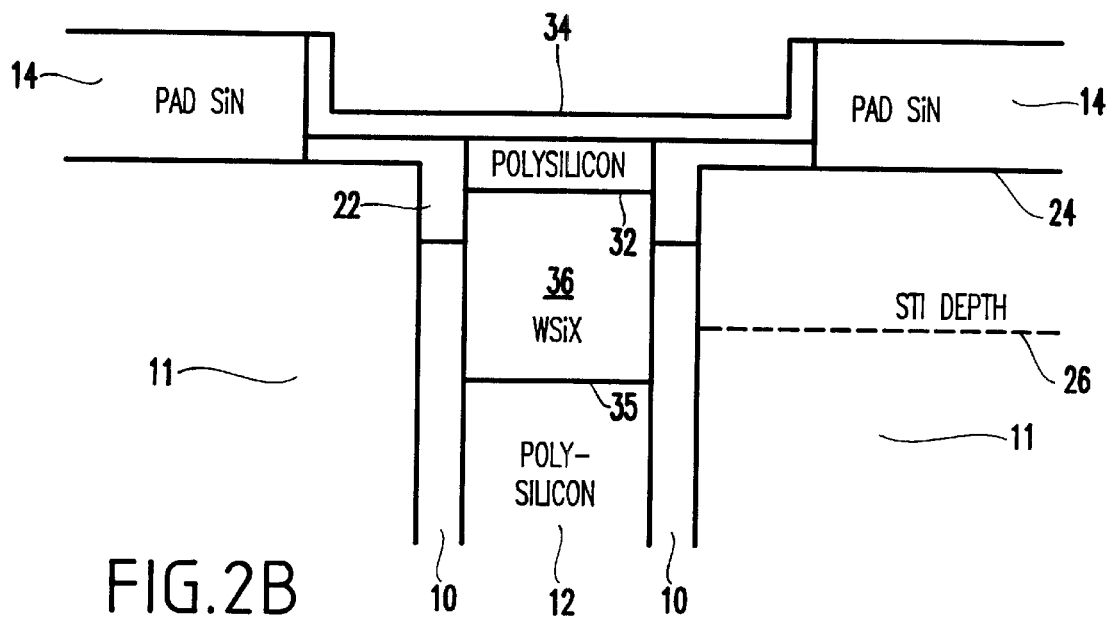
Figure 2C:
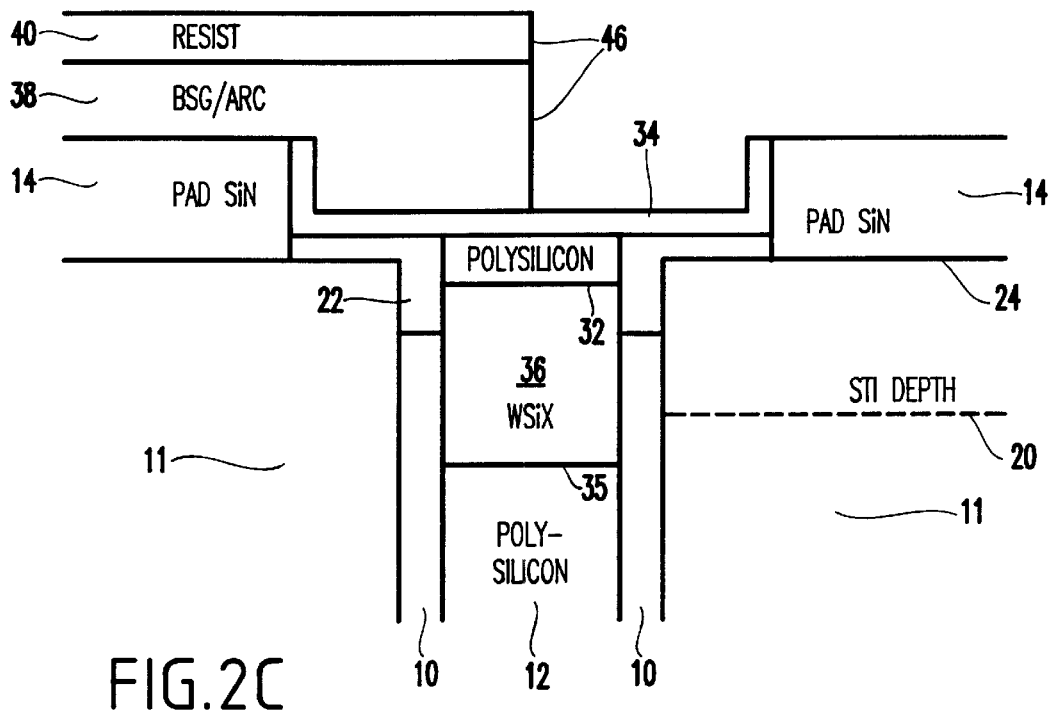
Figure 2D:
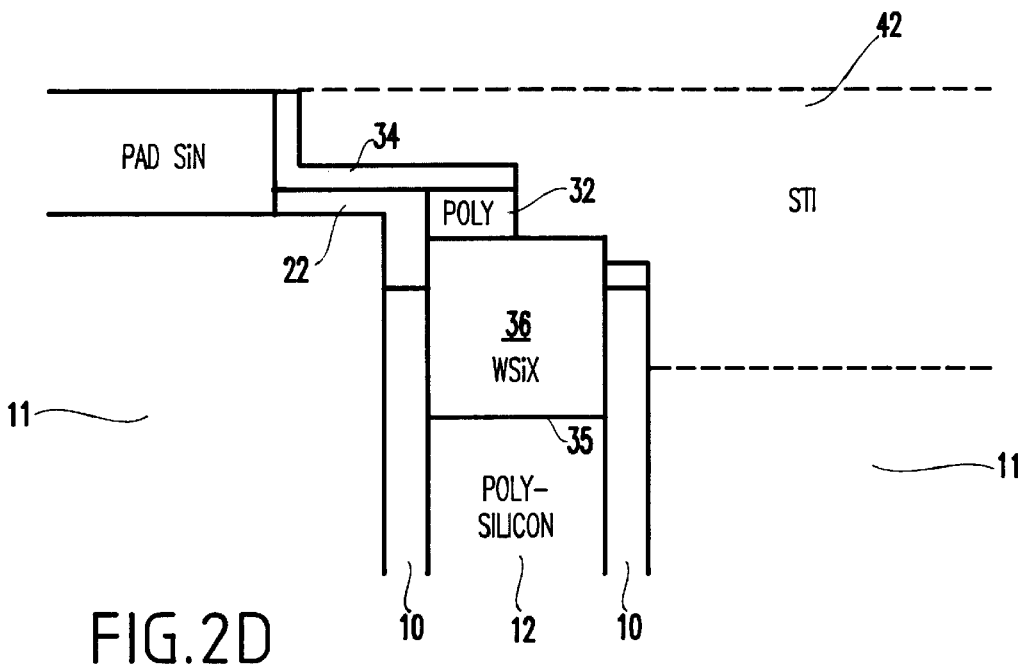

A second embodiment of the invention is shown in FIG. 2d. Unlike FIG. 1b, FIG. 2d shows the invention after the shallow trench isolation (STI) 42 has been performed. A strap is formed that includes three pieces: a first conductor 22, a second conductor (e.g polysilicon) 32 and a third conductor 36. The first and third conductors 22, 36 are preferably formed of materials (e.g. WSix, TiN or TaSiN) that have a higher conductance than either the conductor 12 or second conductor 32 which may be formed of polysilicon.

Figure 3A:
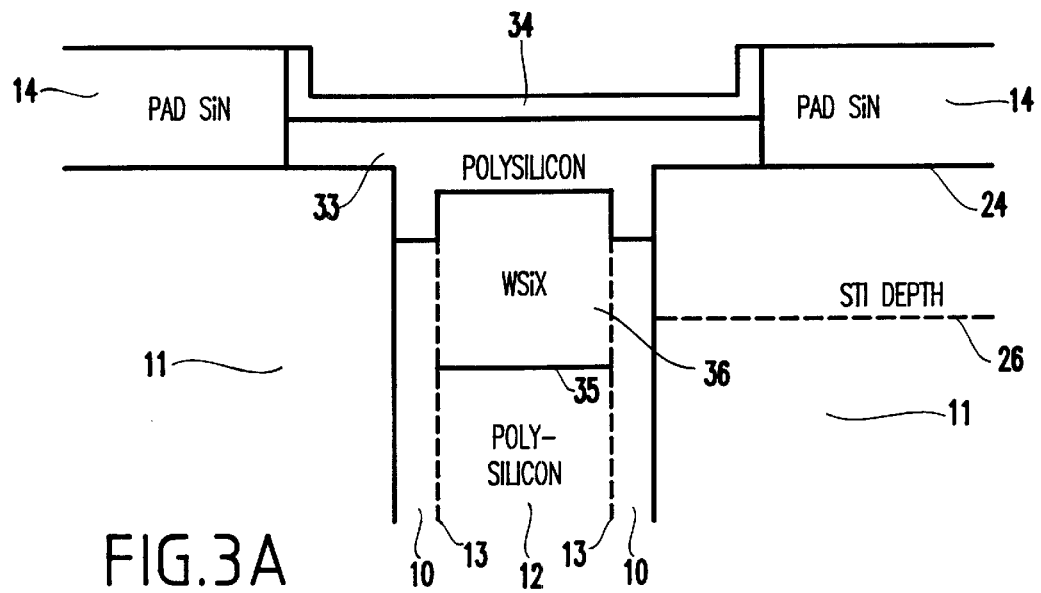
Figure 3B:
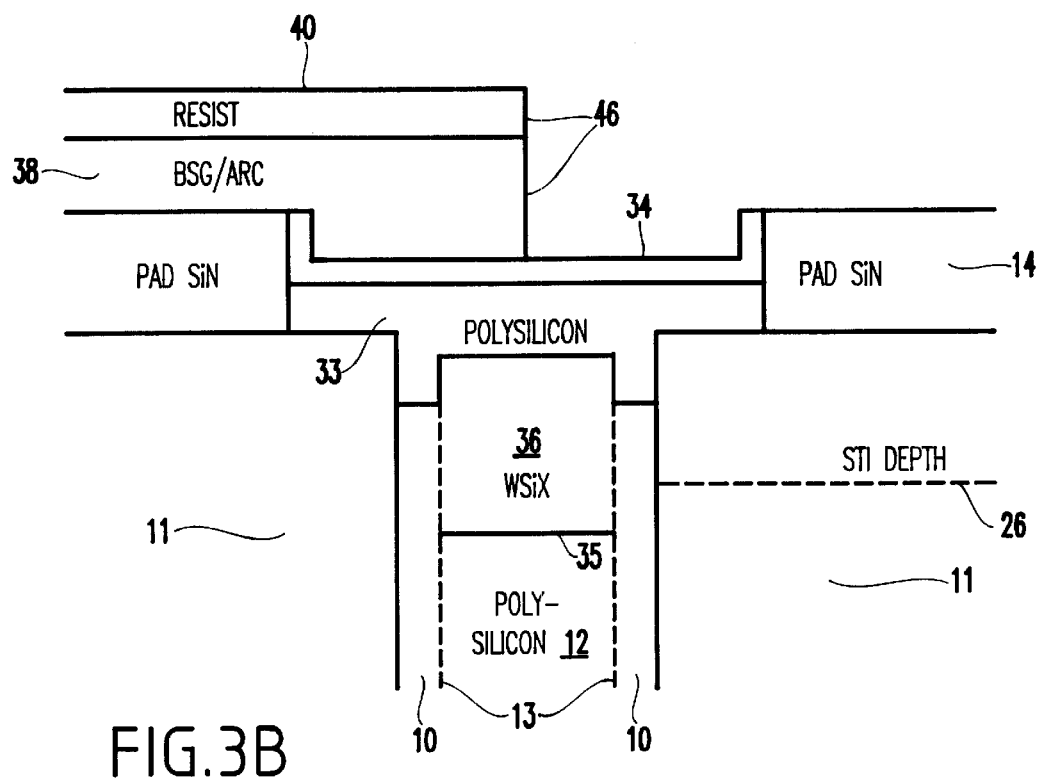
Figure 3C:
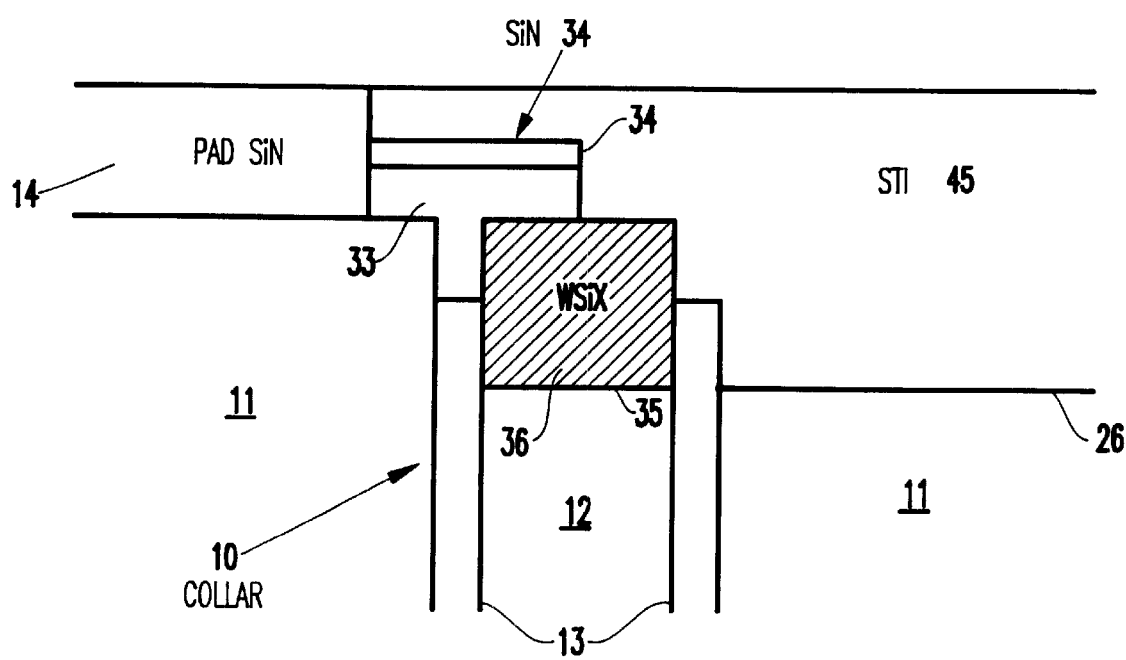

A third embodiment of the invention is shown in FIG. 3c. This embodiment differs from the second embodiment because the strap comprises two conductors 33 and 36 rather than three. However, the strap is still made from two different conductors (e.g. polysilicon and WSix) which have varying conductance.

Note that conductor 22 or 36 could be tungsten (w), but in this case the oxidation post shallow trench isolation should be an oxidation 'selective' to W (such as being rich in hydrogen as is known in the art).

Figure 1A:
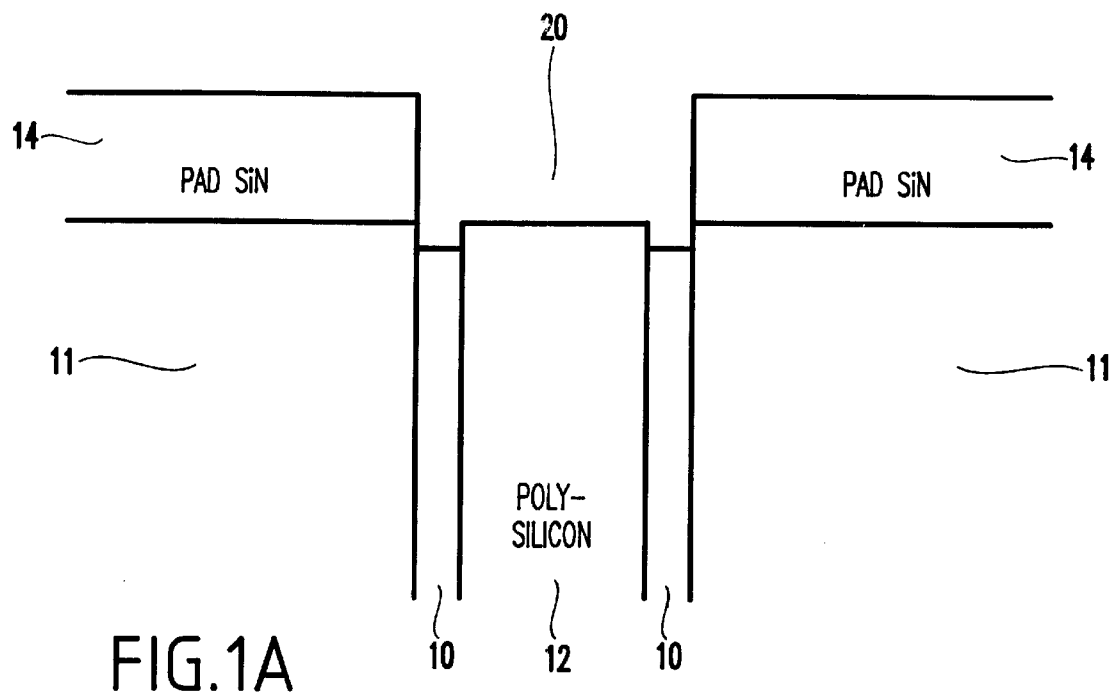

The invention forms each of the three embodiments beginning with the standard DRAM processing procedures until the structure as shown in FIG. 1a is developed. At this point in the formation of the invention, the structure includes a substrate (e.g. mono-crystalline silicon) 11 a collar oxide 10, a conductor (e.g. polysilicon) 12 within the collar oxide 10, pad silicon nitride 14 and a recess 20 of the conductor 12.

The first and second embodiments are then formed in the following manner. As depicted in FIG. 1b, the first conductor 22 (e.g. WSix, TiN or TaSiN) is deposited directly over the collar oxide 10 and adjacent the pad silicon nitride 14 using conventional deposition and patterning techniques well known to those ordinarily skilled in the art. For example, the conductor 12 could be recessed below the silicon surface 24 and the pad nitrides 14 may be pulled back until the collar oxides 10 are exposed. A wet etch of the collar oxides 10 is performed and forms a divot over the collar oxides 10. A first strap 22 of WSix, TiN, TaSiN or other suitable material is then deposited conformally in the remaining divot and along the side wall of the pad silicon nitride 14.

Next, spacers 16 are formed as shown in FIG. 1b. The spacers 16 are etched through to the polysilicon 12, and may be made of tetraethylorthosilicate (TEOS), doped glass or other suitable material well known to those skilled in the art. The spacers 16 may be disposable, but if they are made of TEOS, the spacers 16 need not be disposable. At this point, the first embodiment is complete.

Additional steps are taken to complete the second embodiment. The spacer in this case is preferably small enough to end over the middle of the collar 10 in FIG. 1b. With the spacer in place, a wet etch or RIE is performed until the conductor 12 is recessed below the depth that STI 26 will be performed and recess 35 is formed as shown in FIG. 2a. This etch is selective to the collar oxides 10 and does not remove any portion of the collar oxides 10. The third conductor 36 (e.g. WSix, TiN or TaSiN) is deposited into the recess 35 and recessed to a level 30 below the silicon surface 24, as shown in FIG. 2a. The disposable spacers 16 are then removed using well known methods. A second conductor 32 (e.g. polysilicon) is deposited onto the WSix 36, as shown in FIG. 2a, such that the top surface of the second strap 32 is level with the horizontal portion of the first conductor 22 and flush with the pad SiN.

As shown in FIG. 2b, the first conductor 22 may be removed along the pad SiN 14, and an L-shaped strap is formed. This is easily achieved by modifying the recess of the polysilicon 32 to be selective to the pad SiN 14, but not selective to the conductor 22.

Next, as shown in FIG. 2b, a layer of trench top silicon nitride (TTN) 34 may be deposited over the second conductor 32 and first conductor 22. It may be necessary to anneal the exposed WSix in a Nitrogen ambient before such a nitride deposition. Annealing will prevent unwanted WSix oxidation.

As shown in FIG. 2c, an active array mask 40 is then formed. The AA mask 46 comprises, for example, a laminate of a lower layer 38 of boro-silicate glass or Anti-Reflective Coating ARC (BSG/ARC)or a combination of BSG and ARC. The purpose of this step is to eliminate the non-planarity caused by the recessing of the conductors in the trench. The resist is applied on top of the ARC or (BSG and ARC). FIG. 2c shows the BSG hard mask pattern just before the STI etch.

A shallow trench isolation (STI) 42 is then formed. With the AA resist in place, the AA mask open step etches BSG/ARC, SiN, liner and strap polysilicon. The resist is stripped and the STI etch is selective to WSix and BSG. The BSG is the stripped by known methods. The resulting trench has an L-shape formed by the etched portion of the second conductor 32 and the remaining conductor 36. Next, AA oxidation is performed. However, prior to AA oxidation, annealing in N₂ ambient may be performed if any sidewalls of WSix are exposed. The resulting structure is shown in FIG. 2d.

In the third embodiment, as in embodiments one and two, the conventional DRAM manufacturing process is performed until the point where the structure depicted in FIG. 1a is formed. Also, similar to embodiment two, as shown in FIG. 3a, a recess is formed in the conductor 12. The recess is filled with a conductor (i.e. WSix ) 36, and the conductor 36 is recessed below the silicon surface 24 as shown in FIG. 3a. In FIG. 3a, the collar 10 is formed by local oxidation of silicon (LOCOS) and the node nitride 13 that was formed after the (LOCOS) collar formation is left in place on the inside of the trench.

Next, a surface or 'lip' strap 33 is formed. The pad nitride 14 is pulled back to expose the collar oxides 10, and then, a wet etch is performed over the collar oxides 10. The region is then filled with a conductor (e.g. polysilicon) 33 and recessed above the silicon surface 24.

Note that to improve the active area-deep trench (AA-DT) overlay sensitivity even more, a WSix divot fill may be performed after the wet collar etch, or a combination of WSix and polysilicon might be used as conductor 33. The improvement in overlay comes from the self alignment of the STI etch to the WSix in this trench.

The remainder of the processing is as similar to that in the second embodiment. A layer of TTN 34 is deposited and, as shown in FIG. 3b, and the AA mask 40 is formed. As shown in FIG. 3c, the AA etch however is modified such that, with the resist 36 in place, the polysilicon/TEOS/BSG/ARC on top of the trench is etched to the SiN 14 on top of the 'Lip' strap 33. The etch is then converted to etch SiN selective to the underlying polysilicon 45. The resist is stripped as shown in FIG. 2d, and the main AA etch is etched selective to WSix. Note that the AA oxidation will need an anneal prior to it to prevent anomalous WSix oxidation. The exposed sidewalls of the WSix will be oxidized. The third embodiment leaves the actual strap connection (poly to single crystal) conventional but provides a self alignment for the 'lip' strap.

This invention provides the structure for and method of forming a low resistive strap which has several benefits over conventional straps. The invention decreases the resistance of the strap. The decreased resistance is accomplished by using low resistive conductive materials (e.g., Poly WSix , etc.) as the strap. There may be one section of low resistance material 22 as in embodiment one or a series of materials 22, 32, 36 as in embodiment 2. The placement of a material in the strap that has a lower resistance than the polysilicon (which is traditionally used) lowers the resistance of the entire strap.

Further, the use of low resistance conductive materials such as WSix, TiN or TaSiN as the portions of the strap that interface with the conductor 12 lowers the resistance of the strap-conductor 35 interface.

Also, this invention is highly versatile and may be used with various types of straps for example, buried as well as surface straps.

While the invention has been described in terms of preferred embodiments, those skilled in the art will recognize that the invention can be practiced with modification within the spirit and scope of the appended claims.

What is claimed is:

1. A dynamic random access device comprising:
   a substrate having a trench;
   a conductor in said trench;
   a transistor adjacent said trench and a conductive strap electrically connecting said conductor and said transistor;
   wherein said strap has a lower resistance than said conductor.

2. The dynamic random access device of claim 1, wherein said conductor comprises a first material having a first resistance and said strap comprises a second material different than said first material having a second resistance;
   wherein said second resistance is lower than said first resistance.

3. The dynamic random access device of claim 1, wherein said strap comprises at least two electrically connected strap conductors, and a first strap conductor is adjacent said conductor and a second strap conductor is adjacent said transistor and said first strap conductor has an improved interface with said conductor.

4. The dynamic random access device of claim 3, wherein said strap comprises a lip strap.

5. The dynamic random access device of claim 1, wherein said first said strap forms an L-shape.

6. The dynamic random access device of claim 5, wherein said strap is contiguous with a corner of said trench.

7. The dynamic random access device of claim 1, wherein said strap comprises a first strap conductor and a second strap conductor and said conductor is contiguous with said first strap conductor and said second strap conductor, wherein said second strap conductor and said conductor form an L-shape.

8. A dynamic random access device comprising:
    a substrate having a trench;
    a conductor in said trench;
    a transistor adjacent said trench and a conductive strap electrically connecting said conductor and said transistor;
    wherein said strap comprises a plurality of strap conductors and said strap has a lower resistance than said conductor.

9. The dynamic random access device of claim 8, wherein said conductor comprises a first material having a first resistance and said strap comprises a second material different than said first material having a second resistance;
    wherein said second resistance is lower than said first resistance.

10. The dynamic random access device of claim 8, wherein said plurality of strap conductors comprises at least two electrically connected strap conductors, and a first strap conductor is adjacent said conductor and a second strap conductor is adjacent said transistor and said first strap conductor has an improved interface with said conductor.

11. The dynamic random access device of claim 8, wherein said strap comprises a lip strap.

12. The dynamic random access device of claim 8, wherein said strap forms an L-shape.

13. The dynamic random access device of claim 12, wherein at least a one of said plurality of said strap conductors is contiguous with a corner of said trench.

14. The dynamic random access device of claim 8, wherein said plurality of strap conductors comprises a first strap conductor and a second strap conductor and said conductor is contiguous with said first strap conductor and said second strap conductor such that said second strap conductor and said conductor form an L-shape.

* * * * *